United States Patent
Kubena et al.

(10) Patent No.: US 10,626,011 B1
(45) Date of Patent: Apr. 21, 2020

(54) THIN MEMS DIE

(71) Applicant: HRL Laboratories, LLC, Malibu, CA (US)

(72) Inventors: Randall L. Kubena, Oak Park, CA (US); Hung Nguyen, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/897,893

(22) Filed: Feb. 15, 2018

Related U.S. Application Data (60) Provisional application No. 62/530,676, filed on Jul. 10, 2017.

(51) Int. Cl.
*B81C 1/00* (2006.01)
*B81B 7/00* (2006.01)

(52) U.S. Cl.
CPC ........ *B81C 1/00325* (2013.01); *B81B 7/0051* (2013.01); *B81B 2207/015* (2013.01); *B81B 2207/092* (2013.01); *B81C 2201/0132* (2013.01); *B81C 2203/0118* (2013.01); *B81C 2203/038* (2013.01)

(58) Field of Classification Search
CPC ............ B81C 1/00325; B81C 1/00269; B81C 1/00238; B81C 1/00333; B81C 1/00293; B81C 2201/0132; B81C 2203/0118; B81C 2203/038; B81B 7/0051; B81B 7/02; B81B 7/007; B81B 7/0029; B81B 7/00; B81B 2207/015; B81B 2207/092; H01L 41/094; H01L 41/332; H01L 41/0933; H01L 41/25; H01L 41/0047; H01L 41/1132
See application file for complete search history.

(56) References Cited

U.S. PATENT DOCUMENTS

| 5,145,810 A | * | 9/1992 | Matsumi | G01L 9/0042 438/53 |
|---|---|---|---|---|
| 7,830,074 B2 | | 11/2010 | Kubena et al. | |
| 9,306,537 B1 | * | 4/2016 | Gubser | H03H 9/17 |
| 9,630,834 B2 | * | 4/2017 | Tayebi | B81C 1/00793 |
| 2015/0360936 A1 | * | 12/2015 | Tayebi | B81C 1/00793 257/369 |

OTHER PUBLICATIONS

He et al., "On-Wafer Monolithic Encapsulation by Surface Micromachining With Porous Polysilicon Shell"; Journal of Microelectromechanical Systems, vol. 16, No. 2; Apr. 2007; pp. 462-471.

* cited by examiner

*Primary Examiner* — Nikolay K Yushin

(74) *Attorney, Agent, or Firm* — Ladas & Parry (57) ABSTRACT

An integrated MEMS electronic circuit that comprises a circuit wafer; a micromechanical structure being attached to a first surface of the circuit wafer and electrically coupled to an integrated circuit formed under said first surface. A capping chip having side surfaces substantially perpendicular to its main surfaces comprises a recess and is bonded to the first surface of the circuit wafer such that said micromechanical structure is enclosed in a cavity comprising the recess in the capping chip. Both the circuit wafer and the capping wafer can be further thinned while exposing at least one connection pad on the first surface of the circuit wafer that is not covered by the capping chip and that is coupled electrically to the integrated circuit.

20 Claims, 6 Drawing Sheets

THIN MEMS DIE

RELATED APPLICATIONS

The present application claims priority to U.S. provisional application No. 62/530,676, filed on Jul. 10, 2017, which is hereby incorporated by reference. The present application relates to U.S. Pat. No. 7,830,074, filed Jul. 27, 2007, which is hereby incorporated by reference.

STATEMENT REGARDING FEDERALLY SPONSORED RESEARCH OR DEVELOPMENT

This invention was made with Government support. The Government has certain rights in the invention.

TECHNICAL FIELD

This presentation relates to MEMS devices and to a process for manufacturing MEMS devices.

BACKGROUND

Figure 1A:
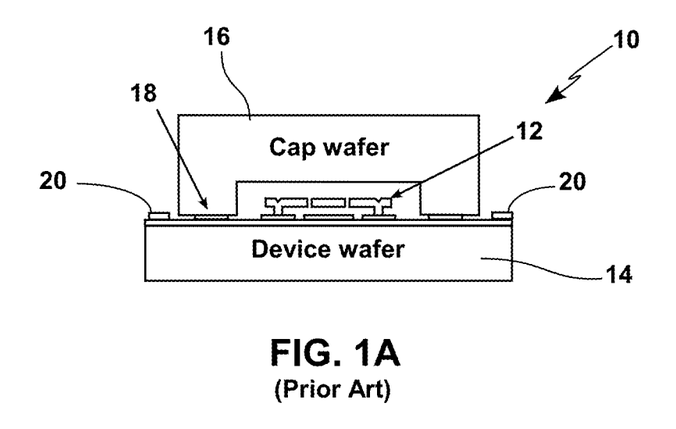
FIG. 1A illustrates a known MEMS device.

MEMS device generally comprise a mechanical structure integrated heterogeneously on an electronic substrate containing wafer-level circuitry, where the mechanical structure is vacuum encapsulated on the wafer. FIG. 1A illustrates a known MEMS device 10 comprising an electromechanical structure 12 integrated heterogeneously on an electronic substrate 14 that comprises wafer-level circuitry (not shown). A cap wafer 16 having a cavity is attached to substrate 14, for example by a ring of welding 18, so as to vacuum-encapsulate the electromechanical structure 12 on the wafer. One way to form a thin MEMS device 10 comprises assembling device 10 using a device wafer 14 and a cap wafer 16 having first thicknesses, then thinning said wafers. However, the inventors have noted that if the substrate wafer 14 contains electronic circuitry (not shown), thinning the substrate wafer can cause the substrate to bow due to the high stresses in the top films used in typical IC processing. Depending on how rigid and thick the capping wafer is, such stress can lead to cracking of the capping wafer.

Additionally, the cap wafer is traditionally etched either with wet or dry processes to expose wire bonding pads 20 previously formed on the device wafer 14 and connected to the wafer-level circuitry (not shown). However, on one hand wet etching through the capping wafer 16 produces sloped sidewalls, which prevents making device 10 compact. On another hand, dry etching of the cap wafer 12, such as Bosch etching, allows obtaining side walls of the cap wafer that are substantially perpendicular to its top surface, but the polymer passivation step in the etch recipe that is needed to produce such substantially perpendicular walls can leave a Teflon-type polymer film on metal bond pads 20; thereby preventing subsequent wire bonding to these pads.

There exists a need for a method that allows high yield manufacturing of thin MEMS devices and/or MEMS devices with walls of the cap wafer that are substantially perpendicular to the top surface of the cap wafer

SUMMARY

Embodiments of this presentation provides for a method to encapsulate, in particular vacuum-encapsulate, MEMS structures at wafer level, which method prevents wafer cracking even with a final device thinned to <500 µm. The method also allows forming walls of the cap wafer that are substantially perpendicular to the top surface of the cap wafer while preventing bond pad contamination.

Embodiments of this presentation relate to a series of steps which allow the substrate and the capping wafer to both be thinned to a high degree by providing tailorable flexibility in the capping wafer. Further, a process according to this presentation allows high-aspect-ratio trenches to be formed while preventing wire bonding pads from being exposed to polymer contamination. This presentation also relates to the product of the above processes and/or novel series of steps.

Embodiments of this presentation relate to an integrated MEMS electronic circuit that comprises a circuit wafer; a micromechanical structure being attached to a first surface of the circuit wafer and electrically coupled to an integrated circuit formed under said first surface. A capping chip has side surfaces substantially perpendicular to said first surface and comprises a recess. The capping chip is bonded to the first surface of the circuit wafer such that the micromechanical structure is enclosed in a cavity comprising the recess in the capping chip. The first surface of the circuit wafer further comprises at least one connection pad that is not covered by the capping chip and that is coupled electrically to the integrated circuit.

An embodiment of this presentation relates to an integrated MEMS electronic circuit comprising: a circuit wafer having opposite first and second surfaces, wherein a micromechanical structure is attached to the first surface of the circuit wafer and electrically coupled to an integrated circuit formed under said first surface; and a capping chip having opposite first and second surfaces and side surfaces, the side surfaces of the capping chip being substantially perpendicular to the first and second surfaces of the capping chip; the second surface of the capping chip comprising a recess having walls substantially perpendicular to the first and second surfaces of the capping chip; wherein the second surface of the capping chip is bonded to the first surface of the circuit wafer such that said micromechanical structure is enclosed in a cavity comprising the recess in the capping chip; and wherein the first surface of the circuit wafer comprises at least one connection pad coupled electrically to said integrated circuit, said a least one connection pad not being covered by the capping chip.

According to an embodiment of this presentation, the micromechanical structure is closer than 100 µm at its nearest extent to the side surfaces of the recess in the capping chip; and the connection pad on the circuit wafer is closer than 100 µm at its nearest extent to the side surfaces of the capping chip.

According to an embodiment of this presentation, the second surface of the capping chip is bonded to the first surface of the circuit wafer by bonding together: a first metal perimeter, formed on said first surface of the circuit wafer and surrounding the micromechanical structure but not the a least one connection pad; and a second metal perimeter of corresponding shape extending on said second surface of the capping chip and surrounding the recess.

According to an embodiment of this presentation, the integrated MEMS electronic circuit has a thickness smaller than 500 micrometer between the second surface of the circuit wafer and the first surface of the capping chip.

According to an embodiment of this presentation, the integrated MEMS electronic circuit has a thickness smaller than 300 micrometer between the second surface of the circuit wafer and the first surface of the capping chip.

According to an embodiment of this presentation, the capping layer comprises a first material, and said second metal perimeter is formed on a layer of an oxide of said first material.

An embodiment of this presentation relates to an integrated MEMS electronic circuit comprising: a circuit wafer having opposite first and second surfaces, wherein a micromechanical structure is attached to the first surface of the circuit wafer and electrically coupled to an integrated circuit formed under said first surface; and a capping chip having opposite first and second surfaces and side surfaces; the second surface of the capping chip comprising a recess having walls; wherein the second surface of the capping chip is bonded to the first surface of the circuit wafer such that said micromechanical structure is enclosed in a cavity comprising the recess in the capping chip; and wherein the first surface of the circuit wafer comprises at least one connection pad coupled electrically to said integrated circuit, said a least one connection pad not being covered by the capping chip; the integrated MEMS electronic circuit having a thickness smaller than 500 micrometer between the second surface of the circuit wafer and the first surface of the capping chip.

According to an embodiment of this presentation, the integrated MEMS electronic circuit has a thickness smaller than 300 micrometer.

According to an embodiment of this presentation, the second surface of the capping chip is bonded to the first surface of the circuit wafer by bonding together: a first metal perimeter, formed on said first surface of the circuit wafer and surrounding the micromechanical structure but not the a least one connection pad; and a second metal perimeter of corresponding shape extending on said second surface of the capping chip and surrounding the recess.

According to an embodiment of this presentation, the capping layer comprises a first material, and the second metal perimeter is formed on a layer of an oxide of said first material.

According to an embodiment of this presentation, the side surfaces of the capping chip and/or the walls of the recess are substantially perpendicular to the first and second surfaces of the capping chip.

An embodiment of this presentation relates to a wafer having first and second main surfaces, the first surface of the wafer comprising at least a first recess having a first depth and at least a second recess surrounding the first recess and having a second depth larger than the first depth.

According to an embodiment of this presentation, the wafer has a metal conductor on its first surface between the first and second recesses.

According to an embodiment of this presentation, at least one of the first and second recesses have walls substantially perpendicular to the first and second surfaces of the wafer.

An embodiment of this presentation relates to a method of manufacturing an integrated MEMS electronic circuit, the method comprising: providing a circuit wafer having opposite first and second surfaces and having an integrated circuit under the first surface of the circuit wafer, as well as at least one connection pad on the first surface of the circuit wafer; said at least one connection pad being connected to said integrated circuit; attaching a micromechanical structure to the first surface of the circuit wafer, such that said integrated circuit couples electrically said at least one connection pad to said micromechanical structure; providing a capping chip wafer having opposite first and second surfaces; etching in the second surface of the capping chip wafer a recess having a first depth; around said recess, etching in the second surface of the capping chip wafer a perimeter trench having a second depth larger than the first depth; bonding the capping chip wafer to the circuit wafer such that said micromechanical structure is enclosed in a cavity comprising the recess in the capping chip wafer and said at least one connection pad is enclosed in a cavity comprising said perimeter trench; and thinning the capping chip wafer from the first surface of the capping chip wafer until said perimeter trench is reached, thus forming out of the capping chip wafer a capping chip, enclosing said micromechanical structure in said cavity comprising the recess in the capping chip wafer; and exposing said at least one connection pad.

According to an embodiment of this presentation, said bonding the capping chip wafer to the circuit wafer comprises: forming a first metal perimeter on said first surface of the circuit wafer such that said at least one connection pad lies outside of said first metal perimeter; forming on the second surface of the capping chip wafer a second metal perimeter having a shape that corresponds to the first metal perimeter; and bonding the second metal perimeter to the first metal perimeter.

According to an embodiment of this presentation, the method comprises dicing the circuit wafer to form an integrated MEMS electronic circuit including said at least one connection pad and said micromechanical structure enclosed in said cavity.

According to an embodiment of this presentation, the method comprises thinning the circuit wafer from the second surface of the circuit wafer before thinning the capping chip wafer.

According to an embodiment of this presentation, the method comprises etching the recess and the perimeter trench by anisotropic plasma etching.

According to an embodiment of this presentation, the method comprises thinning the capping chip wafer with an isotropic plasma etch that does not contain a passivation hydrocarbon gas.

According to an embodiment of this presentation, the method comprises oxidizing the second surface of the capping chip wafer prior to forming the second metal perimeter.

These and other features and advantages will become further apparent from the detailed description and accompanying figures that follow. In the figures and description, numerals indicate the various features; like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Wafer-level encapsulation is critical for most MEMS products. Depending on the device, vacuum encapsulation can also be needed. Although many "MEMS" products separate the mechanical and electrical components on different dies, the ultimate integration goals are usually to combine all components on a single wafer and produce a small die. Such capping process is generic to products such as clocks, timing references, inertial sensors, magnetometers, energy harvesting RF components, small antenna, etc. The industry has a wide range of application for MEMS technology and is also interested in small, low-cost, sensors and RF components as enabled by state-of-the-art packaging techniques.

For many MEMS sensors that have been commercialized to date, the electronics is hybridized on a separate wafer from the MEMS wafer. Thus, stress effects from the electronics wafer does not impact the MEMS or capping wafers if the electronics wafer is thinned. Some manufacturers integrate their electronics and MEMS resonators together but do not vacuum seal their resonators at wafer level thereby not requiring a low-outgassing, strong metal seal for encapsulation. A process according to an embodiment of this presentation is optimized to allow a micromechanical structure, such as an integrated resonator, and an electronic wafer to be bonded to a capping wafer at wafer level using a strong (low-outgassing) bond, typically a metal solder or eutectic bond, and the resulting wafer stack can then be thinned to <300 μm. This compares to the thickness of thin plastic or ceramic hermetic hybrid packages of approximately 1 mm or more that are used for commercial MEMS devices.

Figure 1B:
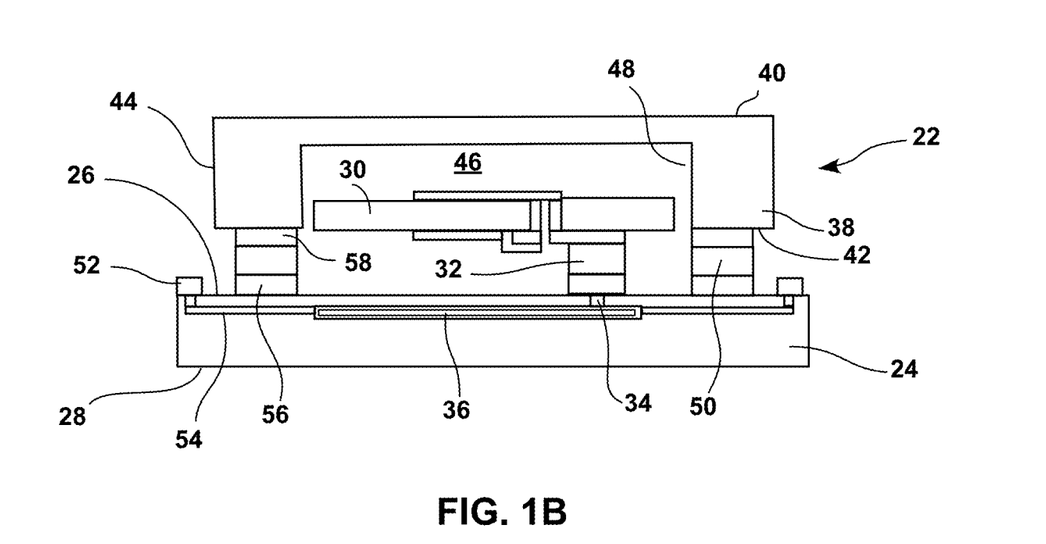
FIG. 1B illustrates a MEMS device according to embodiments of this presentation.

FIG. 1B is a cross-section of an integrated MEMS electronic circuit 22 according to embodiments of this presentation, comprising: a circuit wafer 24 having opposite first 26 and second 28 surfaces, wherein a micromechanical structure 30 (such as an integrated resonator) is attached 32 to the first surface 26 of the circuit wafer 24 and is electrically coupled (for example by a via 34) to an integrated circuit 36 formed under first surface 26. Circuit 22 further comprises a capping chip 38 having opposite first 40 and second 42 surfaces and side surfaces 44, the side surfaces 44 of the capping chip 38 being substantially perpendicular to the first 40 and second 42 surfaces. The second surface 42 of the capping chip 38 comprises a recess 46 having walls 48 substantially perpendicular to the first 40 and second 42 surfaces.

According to embodiments of this presentation, having capping chip walls substantially perpendicular to its main surfaces allows the micromechanical structure 30 to be located very close to the cavities walls within the recess of the capping wafer, and also allows the metal bond pads to be located close to the outer side walls of the capping wafer. This effectively reduces the overall size of the MEMS electronic circuit die. A typical separation between the micromechanical structure 30 to the cavity walls within the recess of the capping wafer and the separation of the metal pads to the side walls of the capping wafer at the closest extent is less than 100 μm. This dimension is ultimately limited by the bond alignment accuracy of the bonding tools used to bond the MEMS and capping wafer to the electronic substrate.

According to an embodiment of this presentation, the second surface 42 of the capping chip 38 is bonded 50 to the first surface 26 of the circuit wafer 24 such that micromechanical structure 30 is enclosed in a cavity comprising the recess 46. According to an embodiment of this presentation, the first surface 26 of the circuit wafer 24 comprises at least one connection pad 52 coupled electrically via a connection 54 to integrated circuit 36, where the respective sizes of capping chip 38 and circuit wafer 24 are such that connection pad 52 is not covered by the capping chip 38.

According to an embodiment of this presentation, the second surface 42 of the capping chip 38 is bonded to the first surface 26 of the circuit wafer 24 by bonding together: a first metal perimeter 56, formed on the first surface 26 of the circuit wafer 24 and surrounding the micromechanical structure 30 but not the at least one connection pad 52; and a second metal perimeter 58 of corresponding shape, extending on the second surface 42 of the capping chip 38 and surrounding the recess 46. Metal perimeters 56 and 58 can be formed by any suitable process; for example metal sputtering. The metal perimeters can be bonded together by any suitable process; for example eutectic bonding. It is noted that alternatively, the circuit wafer 24 and capping chip 38 can be bonded together using adhesives such as glass fret, where appropriate.

As detailed hereafter, the integrated MEMS electronic circuit 22 can have a thickness smaller than 500 micrometer, or even smaller than 300 micrometer, between the second surface 28 of the circuit wafer 24 and the first surface 40 of the capping chip 38. According to an embodiment of this presentation, the capping layer can comprise a first material such as Silicon, and the second metal perimeter 58 is formed on a layer of an oxide of said first material, such as SiO2.

As detailed hereafter, embodiments of this presentation provide that the side surfaces 44 of capping chip 38 and/or the side walls 48 of recess 46 can be etched using dry etch processes, whereby the resulting side surfaces 44 of capping chip 38 and/or the side walls 48 of recess 46 can be substantially perpendicular to for example the top surface 40 of the capping chip 38. According to embodiments of this presentation, the term "substantially perpendicular" means forming an angle of 90 degrees plus or minus 15 degrees; preferably forming an angle of 90 degrees plus or minus 10 degrees; preferably forming an angle of 90 degrees plus or minus 5 degrees.

According to an embodiment of this presentation, the integrated circuit 36 formed under the first surface 26 of the circuit wafer 24 comprises at least one passive element; for example a resistor or a conducting line. According to an embodiment of this presentation, the integrated circuit 36 can be formed under the first surface 26 of the circuit wafer 24 with any appropriate known integrated circuit manufacturing process, for example a CMOS manufacturing process followed by a passivation/oxide layer forming first surface 26.

Embodiments of this presentation relate to methods of manufacturing the circuit illustrated in FIG. 1B.

Figure 2A:
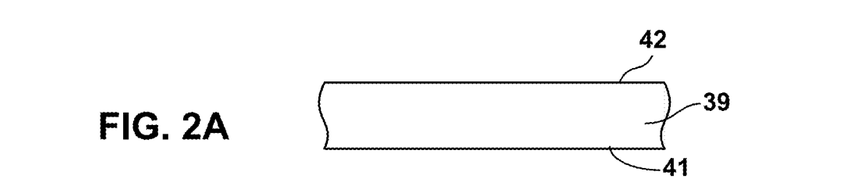
FIGS. 2A to 2J illustrate various steps of a method of manufacturing a MEMS device according to embodiments of this presentation.

As illustrated by FIG. 2A, a method according to embodiments of this presentation comprises providing capping chip wafer 39 having first surface 41 and second surface 42. As detailed hereafter, capping chip 38 is ultimately cut out of capping chip wafer 39. Capping chip wafer 39 can be silicon. Only a small section of capping chip wafer 39 is represented on FIG. 2A, but it is to be understood that wafer 39 extends to the right and left of the section illustrated in FIG. 2A.

Figure 2B:
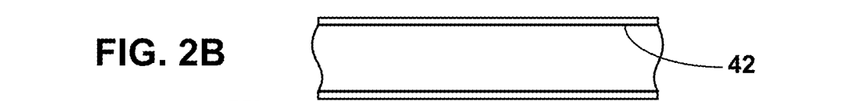

As illustrated by FIG. 2B, a method according to embodiments of this presentation comprises oxidizing at least the second surface 42 of capping chip wafer 39. Such oxidation later prevents electrical conduction from the capping chip wafer 39 to the circuit wafer 24 as well as enhancing the adhesion of subsequent metal layers to the capping wafer 39. The Thickness of the oxide layer can be roughly of 10 nanometer.

Figure 2C:
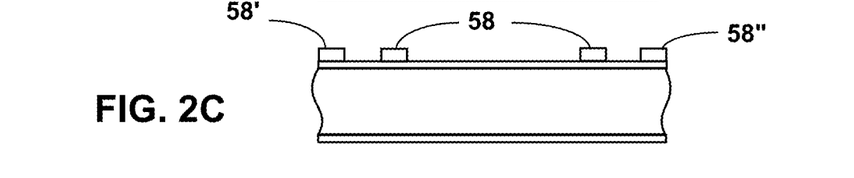

As illustrated by FIG. 2C, a method according to embodiments of this presentation comprises forming seal ring metal/metal perimeter 58 on second surface 42, for example using standard optical lithography. FIG. 2C further illustrates the forming of neighboring metal perimeters 58', 58" of neighboring sections of wafer 39, which as outlined hereafter can be used to form capping chips over neighboring circuits.

Figure 2D:
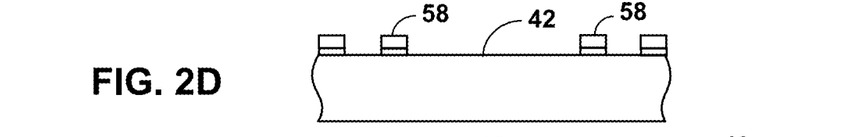
Figure 2E:
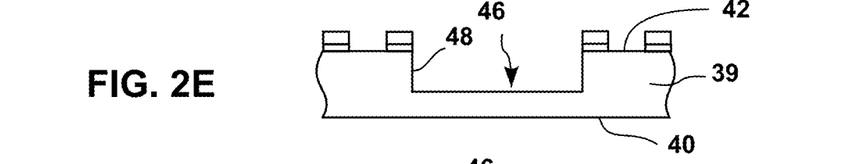

As illustrated by FIGS. 2D and 2E, a method according to embodiments of this presentation comprises etching away the oxide present on surface 42, for example using a buffered oxide etch, then etching cavity 46 in surface 42 of wafer 39, for example with an anisotropic plasma etch; preferably an isotropic plasma etch which does not contain a passivation hydrocarbon gas such as $C_4F_8$.

It is noted that forming cavity 46 with an anisotropic plasma etch allows having walls 48 of cavity 46 that are substantially perpendicular to the surfaces 41, 42 of wafer 39. According to embodiments of this presentation, the cavity 46 has a first depth that is deep enough to provide clearance for the micromechanical electromechanical structure 30 during bonding of wafer 39 on circuit wafer 24.

Figure 2F:
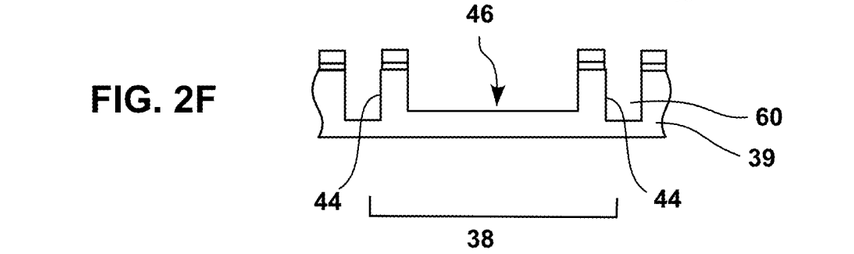

As illustrated by FIG. 2F, a method according to embodiments of this presentation comprises etching on surface 42 around recess 46 a perimeter trench 60 having a second depth, larger than the first depth. It is noted that the second depth ultimately determines the final thickness of the capping chip 38 formed out of the capping wafer 39, and that the walls of the perimeter trench 60 form the side surfaces 44 of the final capping chip 38. Perimeter trench 60 can be etched with an anisotropic plasma etch, thus allowing to have side surfaces 44 substantially perpendicular to surfaces 42, 41. According to embodiments of this presentation, perimeter trench 60 introduces some flexibility in the capping wafer 39 during the thinning of the electronic/circuit wafer 24 in a subsequent step. The inventors have noted that this flexibility in turn reduces the development of high stress across the bonds between wafers 39 and 24, and thus reduces potential cracking of the capping wafer 39. Perimeter trench 60 is wide enough so that connection/bonding pads 52 are enclosed within a cavity comprising perimeter trench 60 when wafer 39 is bonded to wafer 24.

Figure 2G:
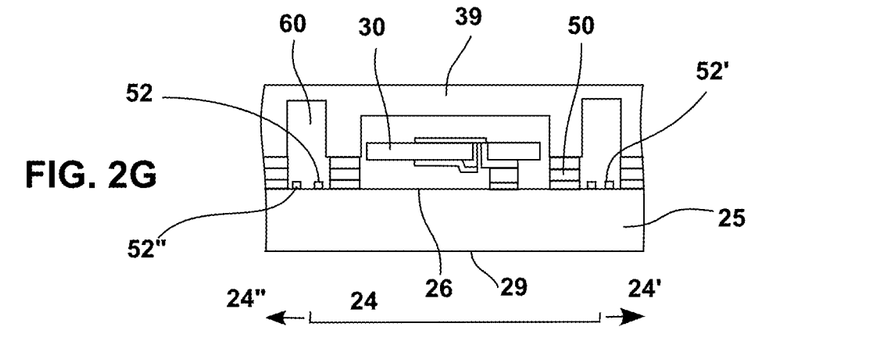

As illustrated by FIG. 2G, a method according to embodiments of this presentation comprises bonding capping wafer 39 (shown flipped with respect to FIG. 2F) to a matrix circuit wafer 25 having opposite first 26 and second 29 surfaces, wherein a micromechanical/electromechanical structure 30 is attached to the first surface 26 of the matrix circuit wafer 25 and is electrically coupled to an integrated circuit 36 formed on or under said first surface 26. It is noted that matrix circuit wafer 25 comprises circuit wafer 24 as well as a plurality of neighboring circuit wafers, including circuit wafers 24', 24" (identical to circuit wafer 24 and carrying each a structure 30) extending to the left and right of circuit wafer 24 in FIG. 2G (a portion only of circuit wafers 24', 24" is illustrated). As illustrated in FIG. 2G, circuit wafer 24 comprises at least one connection pad 52 coupled electrically to the integrated circuit in circuit wafer 24. Consistently, circuit wafers 24', 24" can comprise each at least one connection pad 52', 52" coupled electrically to respectively an integrated circuit in circuit wafers 24', 24". According to an embodiment of this presentation, perimeter trench 60 is arranged such that the connection pads 52, 52', 52" on matrix circuit wafer 25 are located each in a cavity comprising perimeter trench 60 when capping wafer 39 is bonded 50 to matrix circuit wafer 25. According to an embodiment of this presentation, capping wafer 39 is bonded to matrix circuit wafer 25 in a vacuum bonder.

Figure 2H:
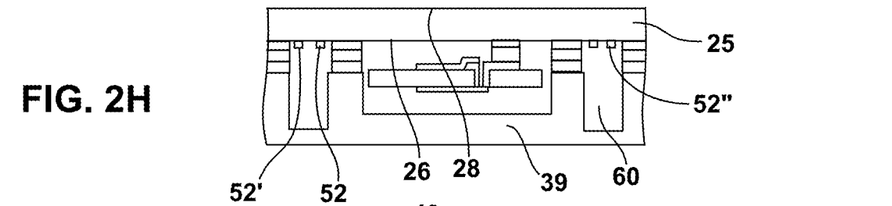

As illustrated by FIG. 2H, a method according to embodiments of this presentation comprises flipping the bonded pair (of capping wafer 39 and matrix circuit wafer 25), mounting it in a plasma etch tool (not shown) and plasma-etching thinning the matrix circuit wafer 25 to the end thickness of circuit wafer 24. The second surface 28 of circuit wafer 24 is formed during this thinning operation. Advantageously, because connection pads 52, 52', 52" are located in the cavity comprising perimeter trench 60, the plasma thinning process of matrix circuit wafer 25 does not smear pads 52, 52', 52" with plasma etching residue and wafer adhesives used in the plasma etch tool are not introduced into the cavity 60.

Figure 2I:
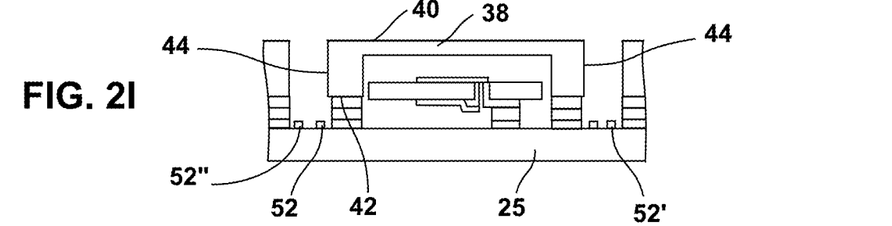

As illustrated by FIG. 2I, a method according to embodiments of this presentation comprises flipping again the bonded pair (of capping chip wafer 39 and matrix circuit wafer 25) and using for example an isotropic Si etch to make thinner the capping chip wafer 39 until the perimeter trench 60 is exposed and capping chip 38 is formed by being separated from the other portions of capping chip wafer 39. Thus, according to embodiments of this presentation no polymer build up or plasma etching residue ends up on connection pads 52, 52', 52", despite having the side surfaces 44 of capping chip 38 formed by anisotropic plasma-etching and being substantially perpendicular to the first 40 and second 42 surfaces of capping chip 38.

Figure 2J:
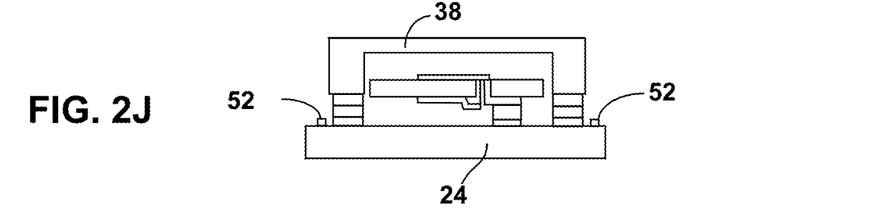

As illustrated by FIG. 2J, a method according to embodiments of this presentation comprises dicing matrix circuit wafer 25 to separate circuit wafer 24, including pad 52, from the other portions of matrix circuit wafer 25. A method according to embodiments of this presentation allows having high yield, vertical sidewalls 44 of the cap, and clean bond pads 52 even with a die thinned to a thickness lower than 500 or even 300 µm.

Figure 3:
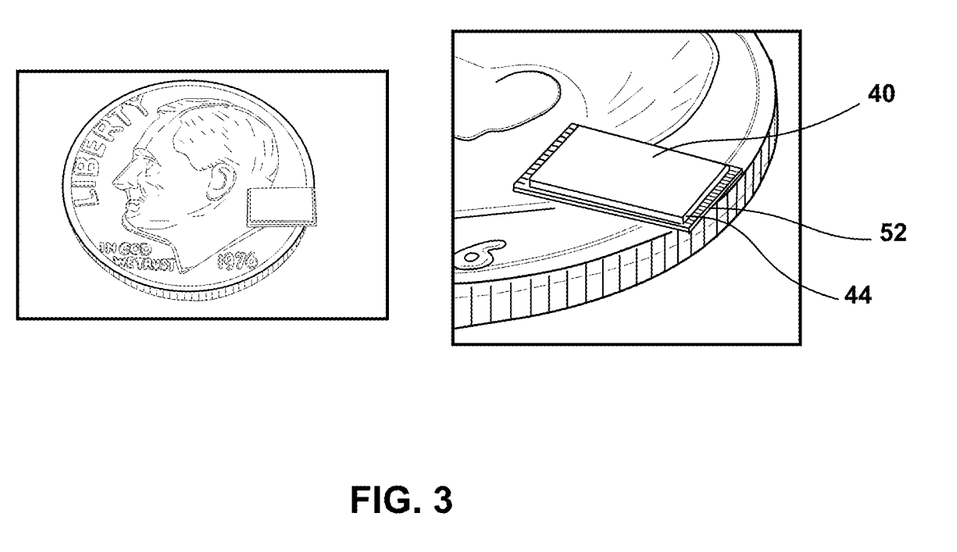
FIG. 3 shows two pictures of a MEMS device according to embodiments of this presentation.

FIG. 3 shows two pictures of a MEMS device according to embodiments of this presentation, of thinned-die vacuum-encapsulated MEMS quartz oscillators on a US dime. The Figure shows the extremely smooth finish of the top surface 40 of the thinned cap, the vertical sidewalls 44 near the bonding pads 52, and the clean bonding pads 52 for wire bonding.

According to an embodiment of this presentation, the portion of the capping chip above the cavity comprising recess 46 can be thin enough to let at least some wavelength of light pass though, thus allowing some light or radiations to illuminate the circuitry on the wafer; for example radiation or light-sensitive circuitry. According to an embodiment of this presentation, it is not necessary to attach a micromechanical structure to the wafer in the cavity.

Figure 4:
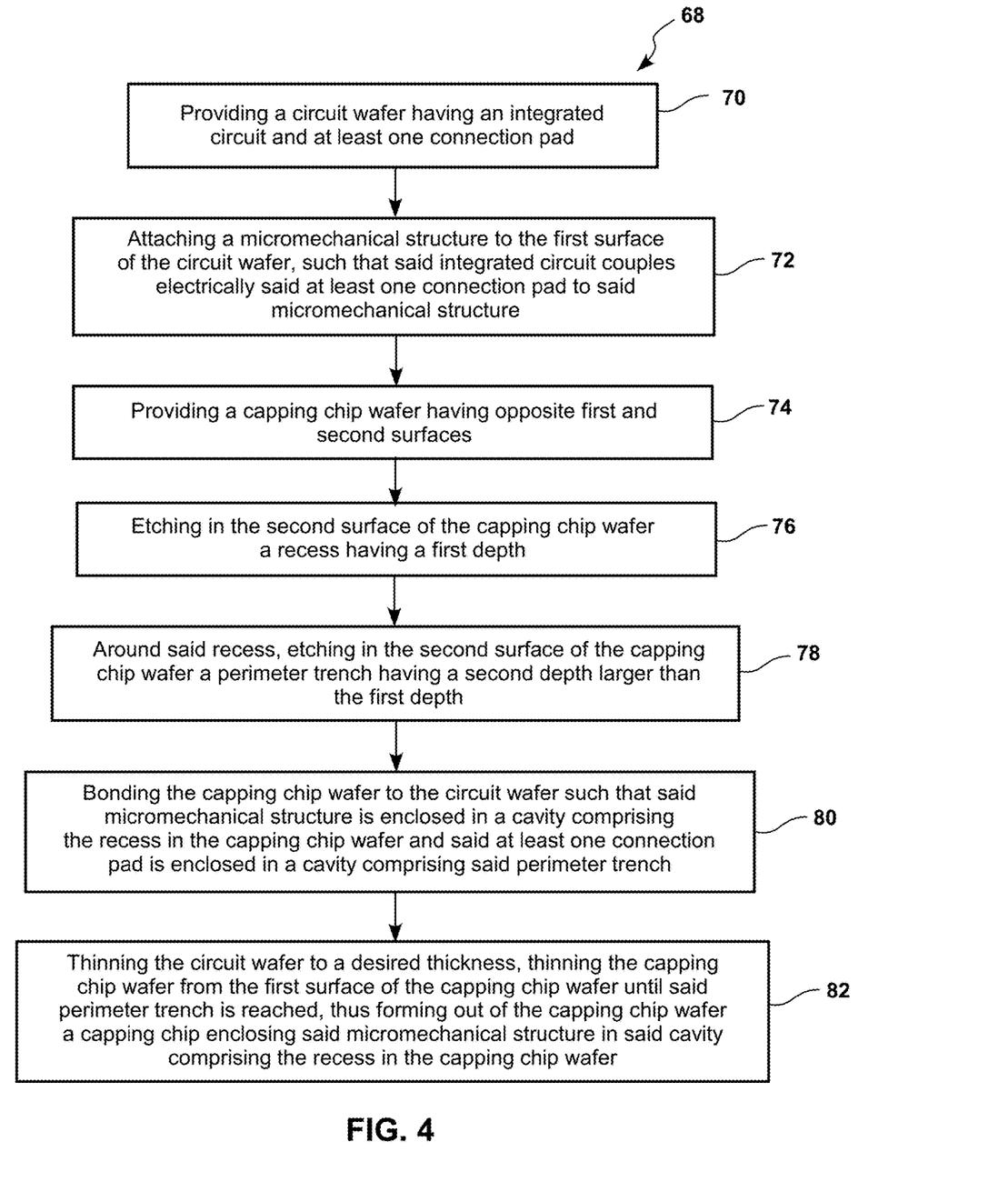
FIG. 4 illustrates a method according to an embodiment of this presentation.

As illustrated in FIG. 4, according to embodiments of this presentation, a method 68 according to embodiments of this presentation comprises:

providing 70 a circuit wafer 24 (as shown for example in FIG. 2G) having opposite first and second surfaces; and having an integrated circuit 36 under or on the first surface of the circuit wafer as well as at least one connection pad 52 on the first surface of the circuit wafer; said at least one connection pad 52 being connected to said integrated circuit 36;

attaching 72 a micromechanical structure 30 to the first surface of the circuit wafer, such that said integrated circuit couples electrically said at least one connection pad to said micromechanical structure (as shown for example in FIG. 2G);

providing 74 a capping chip wafer 39 having opposite first and second surfaces (as shown for example in FIG. 2B);

etching 76 in the second surface of the capping chip wafer 39 a recess 46 having a first depth (as shown for example in FIG. 2E);

around said recess 46, etching 78 in the second surface of the capping chip wafer 39 a perimeter trench 60 having a second depth larger than the first depth (as shown for example in FIG. 2F);

bonding 80 the capping chip wafer 39 to the circuit wafer 24 such that said micromechanical structure 30 is enclosed in a cavity comprising the recess 46 in the capping chip wafer 39 and said at least one connection pad 52 is enclosed in a cavity comprising said perimeter trench 60 (as shown for example in FIG. 2G); and thinning the circuit wafer 24 to the desired thickness; and thinning 82 the capping chip wafer 39 from the first surface of the capping chip wafer until said perimeter trench 60 is reached, thus separating from the remaining portions of the capping chip wafer 39 a capping chip 38 that encloses said micromechanical structure 30 in said cavity comprising recess 46. The circuit wafer can then be diced as detailed previously.

Figure 5:
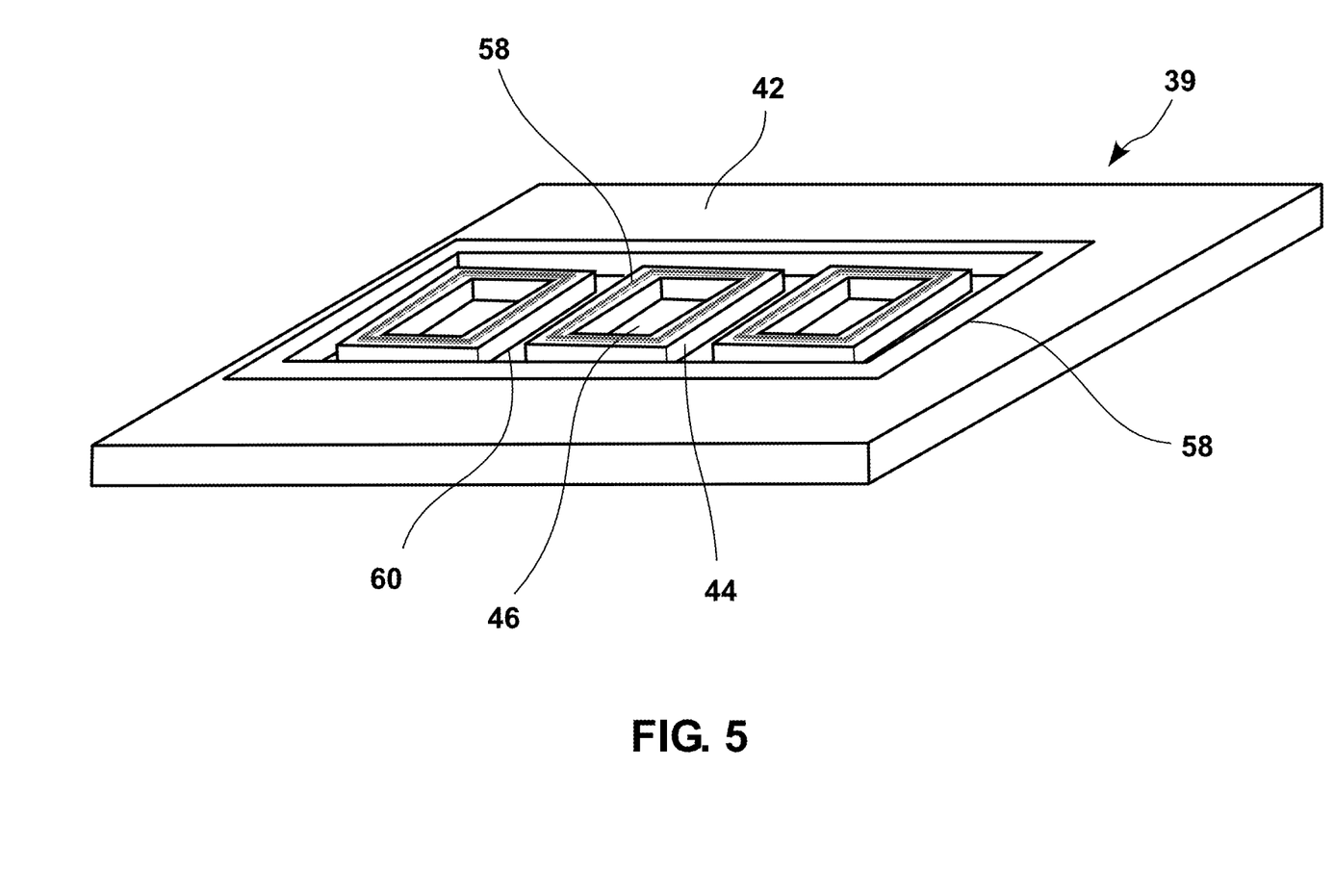
FIG. 5 is an elevation of a capping wafer according to an embodiment of this presentation.

FIG. 5 is an elevation view of a section of a capping chip wafer 39 according to an embodiment of this presentation, such as illustrated for example in FIG. 2F. The top surface 42 of the wafer 39 comprises at least a first recess 46 having a first depth and at least a second recess, or perimeter trench, 60 surrounding the first recess 46 and having a second depth larger than the first depth. Wafer 39 can comprise a plurality of recesses 46 each surrounded by second recess 60, such that wafer 39 can be bonded as illustrated in FIG. 2G on a corresponding matrix circuit wafer 25, having a plurality of circuits 36, a plurality of coupled micromechanical structures 30 and a plurality of connection pads 52, such that each micromechanical structure 30 is enclosed in a cavity comprising one of the recesses 46. FIG. 5 illustrates only three aligned recesses 46, but in practice it can comprise a larger number of recesses arranged over all or part of the wafer 39. A metal layer perimeter 58 can also be formed on surface 42 around each recess 46. As shown in FIG. 2F.

According to an embodiment of this presentation, a metal perimeter 58 is also formed around perimeter trench 60, which is to be bonded to a corresponding perimeter on matrix circuit wafer 25, such that no etching residue can enter the cavity comprising trench 60 for example when thinning the back of matrix circuit wafer 25 as illustrated in FIG. 2H.

According to an embodiment of this presentation, wafer 39 can comprise a single recess 46 and matrix circuit wafer 25 a single circuit 36. Such embodiment is for example illustrated by FIGS. 2A to 2J, by considering that no additional structures are present to the left or right of the illustrated structures.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. An integrated MEMS electronic circuit wafer comprising:
   a matrix circuit wafer comprising a plurality of neighboring circuit wafers having each opposite first and second surfaces, wherein a micromechanical structure is attached to the first surface of each circuit wafer and is electrically coupled to an integrated circuit formed under said first surface, and wherein each circuit wafer comprises on said first surface at least one connection pad coupled electrically to the integrated circuit of said circuit wafer; and
   a capping wafer having opposite first and second surfaces, the second surface of the capping wafer comprising a plurality of recesses having a first depth and having walls substantially perpendicular to the first and second surfaces of the capping wafer, the plurality of recesses being separated by perimeter trenches formed in the second surface and having a second depth larger than the first depth and having walls substantially perpendicular to the first and second surfaces of the capping wafer;
   wherein the second surface of the capping wafer is bonded to the first surface of the circuit wafer such that each of said micromechanical structure is enclosed in a cavity comprising one of said recesses in the capping wafer; and wherein each said at least one connection pad coupled electrically to said integrated circuits is enclosed in a cavity comprising the perimeter trenches of the capping wafer.

2. The integrated MEMS electronic circuit wafer of claim 1 wherein the micromechanical structure is closer than 100 µm at its nearest extent to the side surfaces of the recess in the capping chip;
   and wherein the connection pad on the circuit wafer is closer than 100 µm at its nearest extent to the side surfaces of the capping chip.

3. The integrated MEMS electronic circuit wafer of claim 1, wherein the second surface of the capping chip is bonded to the first surface of the circuit wafer by bonding together: a first metal perimeter, formed on said first surface of the circuit wafer and surrounding the micromechanical structure but not the a least one connection pad; and
    a second metal perimeter of corresponding shape extending on said second surface of the capping chip and surrounding the recess.

4. The integrated MEMS electronic circuit wafer of claim 3, wherein the capping layer comprises a first material, and wherein said second metal perimeter is formed on a layer of an oxide of said first material.

5. The integrated MEMS electronic circuit wafer of claim 1, having a thickness smaller than 500 micrometer between the second surface of the circuit wafer and the first surface of the capping chip.

6. The integrated MEMS electronic circuit wafer of claim 5, having a thickness smaller than 300 micrometer between the second surface of the circuit wafer and the first surface of the capping chip.

7. An integrated MEMS electronic circuit wafer comprising:
    a matrix circuit wafer comprising a plurality of neighboring circuit wafers having each opposite first and second surfaces, wherein a micromechanical structure is attached to the first surface of each circuit wafer and is electrically coupled to an integrated circuit formed under said first surface, and wherein each circuit wafer comprises on said first surface at least one connection pad coupled electrically to the integrated circuit of said circuit wafer; and
    a capping wafer having opposite first and second surfaces the second surface of the capping wafer comprising a plurality of recesses having walls and having a first depth; the plurality of recesses being separated by perimeter trenches formed in the second surface and having a second depth larger than the first depth and having walls substantially perpendicular to the first and second surfaces of the capping wafer;
    wherein the second surface of the capping wafer is bonded to the first surface of the circuit wafer such that each of said micromechanical structure is enclosed in a cavity comprising one of said recesses in the capping wafer; and wherein each said at least one connection pad coupled electrically to said integrated circuit is enclosed in a cavity comprising the perimeter trenches of the capping wafer;
    the integrated MEMS electronic circuit having a thickness smaller than 500 micrometer between the second surface of the circuit wafer and the first surface of the capping chip.

8. The integrated MEMS electronic circuit wafer of claim 7, having a thickness smaller than 300 micrometer.

9. The integrated MEMS electronic circuit wafer of claim 7, wherein the second surface of the capping chip is bonded to the first surface of the circuit wafer by bonding together: a first metal perimeter, formed on said first surface of the circuit wafer and surrounding the micromechanical structure but not the a least one connection pad; and
    a second metal perimeter of corresponding shape extending on said second surface of the capping chip and surrounding the recess.

10. The integrated MEMS electronic circuit wafer of claim 9, wherein the capping layer comprises a first material, and wherein said second metal perimeter is formed on a layer of an oxide of said first material.

11. The integrated MEMS electronic circuit wafer of claim 9, wherein the side surfaces of the capping chip and the walls of the recess are substantially perpendicular to the first and second surfaces of the capping chip.

12. A wafer having first and second main surfaces, the first surface of the wafer comprising at least a first recess having a first depth and at least a second recess surrounding the first recess and having a second depth larger than the first depth; wherein the first and second recesses have walls substantially perpendicular to the first and second surfaces of the wafer.

13. The wafer of claim 12, having a metal conductor on its first surface between the first and second recesses.

14. A method of manufacturing an integrated MEMS electronic circuit, the method comprising:
    providing a matrix circuit wafer comprising a plurality of neighboring circuit wafers having each opposite first and second surfaces and having each an integrated circuit under the first surface, as well as at least one connection pad on the first surface; said at least one connection pad being connected to said integrated circuit;
    attaching a micromechanical structure to the first surface of each circuit wafer, such that said integrated circuit couples electrically said at least one connection pad to said micromechanical structure;
    providing a capping wafer having opposite first and second surfaces;
    etching in the second surface of the capping wafer a plurality of recesses having each a first depth;
    around said recesses, etching in the second surface of the capping wafer a plurality of perimeter trenches having a second depth larger than the first depth;
    bonding the capping wafer to the matrix circuit wafer such that each said micromechanical structure is enclosed in a cavity comprising one of the recesses in the capping wafer and each said at least one connection pad is enclosed in a cavity comprising said perimeter trenches; and
    thinning the capping wafer from the first surface of the capping wafer until said perimeter trench is reached, thus forming out of the capping wafer a plurality of capping chips enclosing each one of said micromechanical structure in a cavity comprising one of the recesses in the capping chip wafer; and exposing said at least one connection pad.

15. The method of claim 14, wherein said bonding the capping wafer to the matrix circuit wafer comprises:
    forming each of a plurality of first metal perimeters on said first surface of each circuit wafer such that said at least one connection pad lies outside of said first metal perimeter;
    forming on the second surface of the capping wafer a plurality of second metal perimeters having a shape that corresponds to the plurality of first metal perimeters; and
    bonding the second metal perimeters to the first metal perimeters.

16. The method of claim 14, comprising dicing the matrix circuit wafer to form a plurality of integrated MEMS electronic circuits including each said at least one connection pad and said micromechanical structure enclosed in said cavity.

17. The method of claim 14, comprising thinning the matrix circuit wafer from the second surface of the circuit wafer before thinning the capping wafer.

18. The method of claim 14, comprising etching the recess and the perimeter trench by anisotropic plasma etching.

19. The method of claim 14, comprising thinning the capping wafer with an isotropic plasma etch which does not contain a passivation hydrocarbon gas.

20. The method of claim 14, comprising oxidizing the second surface of the capping wafer prior to forming the second metal perimeter.

\* \* \* \* \*